United States Patent [19]

Frye et al.

[11] Patent Number: 4,501,060

[45] Date of Patent: Feb. 26, 1985

[54] DIELECTRICALLY ISOLATED SEMICONDUCTOR DEVICES

[75] Inventors: Robert C. Frye, Piscataway; Joseph E. Griffith, New Providence; Yiu H. Wong, Berkeley Heights, all of N.J.

[73] Assignee: AT&T Bell Laboratories, Murray Hill, N.J.

[21] Appl. No.: 460,399

[22] Filed: Jan. 24, 1983

[51] Int. Cl.³ .................... H01L 21/306; H01L 21/76
[52] U.S. Cl. .............................. 29/576 W; 29/576 E; 29/2 W; 29/576 J; 29/580; 29/585; 65/40; 65/59.3; 148/175; 156/272; 156/273.9; 204/16; 357/49; 357/73
[58] Field of Search ............. 29/576 E, 576 W, 576 J, 29/580, 584-586; 148/175; 156/273.9, 272; 65/40, 59.3; 357/49, 73; 204/16

[56] References Cited

U.S. PATENT DOCUMENTS

| 3,290,760 | 12/1966 | Cave | 29/576 J |
|---|---|---|---|
| 3,397,278 | 8/1968 | Pomerantz | 357/49 X |
| 3,416,224 | 12/1968 | Armstrong et al. | 357/49 X |
| 3,513,042 | 5/1970 | Hagon | 148/187 |
| 3,623,219 | 11/1971 | Stoller et al. | 29/580 |
| 3,689,357 | 9/1972 | Jordan | 357/49 X |
| 3,900,811 | 8/1975 | Kurtz et al. | 338/2 |
| 4,017,341 | 4/1977 | Suzuki et al. | 148/175 X |
| 4,121,334 | 10/1978 | Wallis | 29/589 |
| 4,169,000 | 9/1979 | Riseman | 29/576 W |
| 4,268,348 | 5/1981 | Allison et al. | 29/576 W |

OTHER PUBLICATIONS

Brooks et al., "Low-Temperature Electrostatic Silicon-to-Silicon . . . ", J. Electrochem. Soc., vol. 119, No. 4, Apr. 1972, pp. 545-546.
"Field Assisted Glass Sealing," *Electrocomponent Science and Technology*, 2(1), 45-53 (1975), George Wallis.
*Electrochemical Society Reviews and News*, 117(11), 405C, Abstract 239 RNP, "Thin High-Quality Silicon Layers on Insulating Substrates," George Wallis et al.

*Primary Examiner*—William G. Saba
*Attorney, Agent, or Firm*—Bruce S. Schneider

[57] ABSTRACT

Dielectrically isolated single crystal silicon of high quality is produced by an extremely convenient process. This process involves the fusing of two silicon bodies where at least one of these bodies has a region of silicon oxide. The bodies are contacted so that the silicon oxide is at an interface between the two bodies. The bodies are then heated to an elevated temperature while applying a nominal electrical potential across the interface. This combination of applied potential and temperature permanently fuses the two bodies without producing any significant damage to the crystal quality of these bodies.

6 Claims, 7 Drawing Figures

FIG. I (PRIOR ART)

FIG. 3
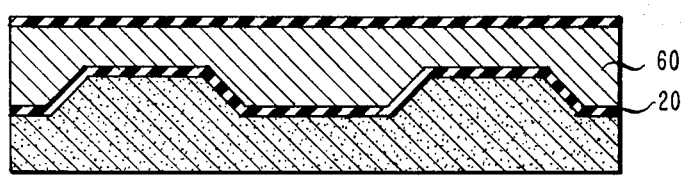
3A
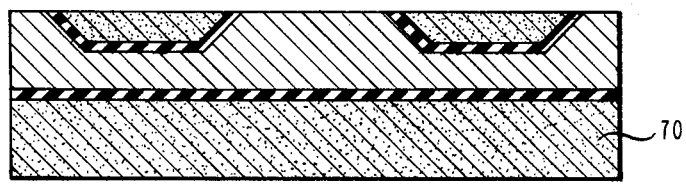
3B
FIG. 4
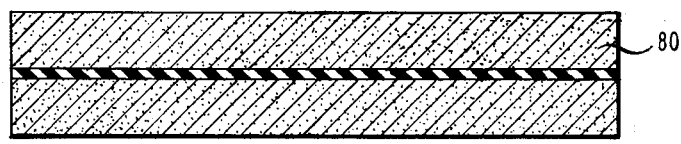
4A
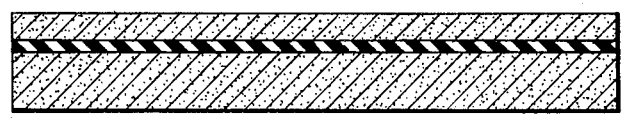
4B
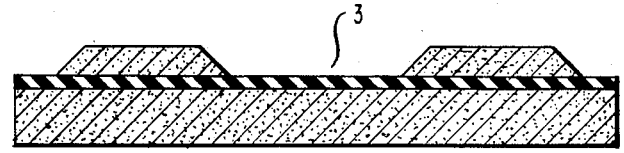
4C

DIELECTRICALLY ISOLATED SEMICONDUCTOR DEVICES

BACKGROUND OF THE INVENTION

1. Field of the Invention

This invention relates to semiconductor devices and, in particular, to dielectrically isolated semiconductor devices.

2. Art Background

In most electronic components, such as integrated circuits, electrical isolation is produced between regions of essentially single crystal silicon by junction isolation. (Single crystal silicon is silicon having defects, e.g., linear and planar defects such as dislocations or stacking faults, respectively, in a density through the crystal of less than $10^8$ defects per $cm^{+2}$.) In this junction approach, lateral isolation is accomplished by interposing between the active single crystal silicon regions, a region of opposite electrical type from that of the active region. The thickness of this added region is approximately equal to the depth of the active regions of the single crystal materials being separated. Similarly, vertical isolation in the junction approach is obtained by the presence of material of opposite conductivity type positioned below the active region. (The active region is that portion of the single crystal silicon which is ultimately to be modified to contain electronic device structures. The active region is typically 1 $\mu$m thick for nominal voltage devices.) Such rectifying junctions formed at the boundaries of the active regions of opposite type provide lateral and vertical isolation when appropriately biased. For some applications lateral junction isolation is replaced with lateral dielectric isolation to save space and to reduce capacitance. (Lateral dielectric isolation entails the presence of an insulator, such as silicon dioxide or air, rather than a material of opposite conductivity type at the lateral boundaries of the active region.) By expedients such as junction isolation or lateral dielectric isolation, transistors or other devices formed in one single crystal region, i.e., one active region, are electrically isolated and are prevented from interacting with devices in a second active region.

However, for some significant applications, the use of junction isolation or a combination of junction and lateral dielectric isolation is not sufficient. For example, in some instances, the voltage employed in operation is often large enough to cause electrical breakdown between separate active regions. This electrical breakdown occurs through many paths such as by the penetration of charge carriers below one active region through the underlying substrate, across the substrate under the lateral isolation region, and into the second active region. When a typical junction isolation structure is employed, the voltages encountered in some applications, such as telephone line interface circuits, are sufficient to cause breakdown by charge carrier penetration through the isolation regions. To prevent such undesirable electrical interaction between two active regions, a combination of lateral and vertical dielectric isolation is employed. This dielectric isolation is provided by surrounding the single crystal silicon regions with an electrically insulating dielectric material. By this expedient, interaction between active regions even at high voltages is avoided. Although it is possible in theory to increase the insulating capability of junction isolation to prevent breakdown in high-voltage devices, a high-voltage application requires a correspondingly high resistivity in the junction isolation region. Since the size of the depletion region increases with both voltage and resistivity, enhanced breakdown characteristics require, for junction isolation, an extremely large volume devoted to isolation. By employing dielectric isolation, equivalent isolation is obtainable in a much smaller volume which, in turn, greatly reduces electronic component area and cost.

Dielectric isolation is also advantageously used in devices operating at nominal voltages where enhanced reliability and performance are desirable. The additional insulating material that provides the vertical dielectric isolation also prevents electron-hole pairs formed in the underlying substrate by thermal processes or by ionizing radiation from migrating to an active region and, thus, introducing errors in the processing of information by the electronic devices in this region. Moreover, dielectric isolation introduces significantly less capacitance than does junction isolation for comparable device feature dimensions. Lower capacitance, in turn, allows higher operating speed with less power dissipation—a result which is quite desirable especially in low-voltage logic circuitry.

Additionally, for some significant device applications junction isolation is not adequate under any circumstances. A reverse biased junction, as used in junction isolation, blocks the flow of only majority carriers (i.e., electrons in n-type semiconductor materials and holes in p-type) and collects minority carriers. For some bipolar devices it is necessary that the isolation region block the flow of both carrier types. Thus, such devices require dielectric isolation.

A variety of processes have been employed to produce semiconductor components having dielectric isolation. The majority of these processes have been directed to producing a thin, i.e., less than 3 microns, dielectrically isolated active region. In a number of these processes directed to producing thin active regions, a precursor structure is fabricated by first forming patterned regions of dielectric material, e.g., silicon oxide, on a single crystal silicon substrate. Silicon is deposited onto this structure which results in non-single crystal material, e.g., amorphous or polycrystalline silicon, overlying the dielectric regions and contacting the substrate portions exposed between these regions. The non-single crystal silicon is then treated to cause growth of single crystal silicon at the non-single crystal silicon/substrate interface and to propagate this single crystal through the non-single crystal silicon region. This propagation is done by melting a discrete zone containing both the single crystalline and non-single crystal material and then propagating this discrete zone through the non-single crystal region in a manner akin to a zone refining process.

One of the few and the most established method for producing a thick, i.e., 3 $\mu$m or thicker, dielectrically isolated active region has been described by K. E. Bean and W. R. Runyan, in the *Journal of the Electrochemical Society*, 124, 50 (1977). This process, possibly because of the desire to produce thick, dielectrically isolated single crystal silicon, does not involve a melting procedure which propagates a nucleated crystal through the polycrystalline region by translating a discrete molten zone. Instead, an elaborate series of deposition and etching steps, as shown in FIG. 1, is utilized. Briefly, the steps involve the treatment of a high-quality single crystal substrate. This silicon substrate, 1A in FIG. 1, is coated with a suitable masking material, such as silicon dioxide, 3, and holes, 5, are formed in the oxide by conventional techniques, e.g., photolithography and oxide etching. Grooves, 7, are then anisotropically etched in the exposed portions of the silicon underlying the holes in the dielectric material. The masking oxide is removed and the entire surface is epitaxially coated with an optional layer of N+ silicon, 8. The N+ silicon is, in turn, coated with an insulator, 9, such as silicon dioxide. The insulator is once again, in turn, coated with a layer of polysilicon, 10. The structure is then inverted and the silicon substrate is ground off and polished until the structure shown at 1G is obtained. In this structure, the remaining single crystal silicon is denoted by 12 and 15, the insulating layer is indicated by 14, and polysilicon is indicated by 16. Thus, the final structure has single crystal silicon, 12 and 15, on an electrically insulating material.

As can be appreciated from the previous description and from FIG. 1, dielectric isolation of thick silicon active regions involves a multitude of complicated processing steps. Additionally, the extensive processing employed introduces high levels of defects into the single crystal active regions and results in low yields of useful devices. For example, as the silicon oxide layer, 9, is grown, an extreme amount of compressive stress develops at the apex area, 17, of the silicon oxide layer, 9. This stress exerts a concomitant force on the adjacent single crystal silicon, 12, which results in extensive defect formation. This defect formation is further aggravated by stresses induced by the polysilicon during subsequent thermal processing with a concomitant loss in yield. Thus, components involving thick, dielectrically isolated regions of silicon have only been used for applications which require production of devices where properties are critical and expense is a secondary factor.

SUMMARY OF THE INVENTION

Thick layers of dielectrically isolated high-quality silicon are formed by an extremely convenient process. This process involves the fusing of two silicon bodies. One or both of the bodies is chosen so that in regions where devices are to be formed, high-quality, i.e., a defect density less than $10^6$ cm$^{-2}$, preferably less than $10^4$ cm$^{-2}$, single crystal silicon is present. One or both of the bodies is also chosen to have a surface at least a portion of which includes a silicon oxide. Significantly this silicon oxide region should include OH moieties. (Such moieties are included in the oxide, for example, by forming the oxide by steam oxidation. In this manner, the interaction of water with the silicon produces OH entities.) The bodies are contacted so that the silicon oxide region is present at the interface between the two bodies. A nominal electrical potential, i.e., less than 100 volts, is applied across the interface and the structure is heated to a temperature above 1050 degrees C. Through the presence of OH moieties and through the use of a nominal voltage and elevated temperatures, a fusion between the bodies in the region of the silicon oxide is produced resulting in a composite structure having a substrate which is separated by a layer of silicon oxide from a high-quality, single crystal silicon active region. The fusion bond attainable is so strong that attempts to mechanically separate the previously independent bodies produce fracture, not along the plane of the bond, but randomly throughout the oxide. Essentially no degradation to the device quality silicon is induced through the inventive process. Thus, in an expeditious manner, dielectrically isolated silicon material of extremely high quality and dielectrically isolated devices are producible.

BRIEF DESCRIPTION OF THE DRAWINGS

FIGS. 2 through 6 illustrate the inventive method of producing dielectrically isolated silicon devices.

DETAILED DESCRIPTION

Figure 1:
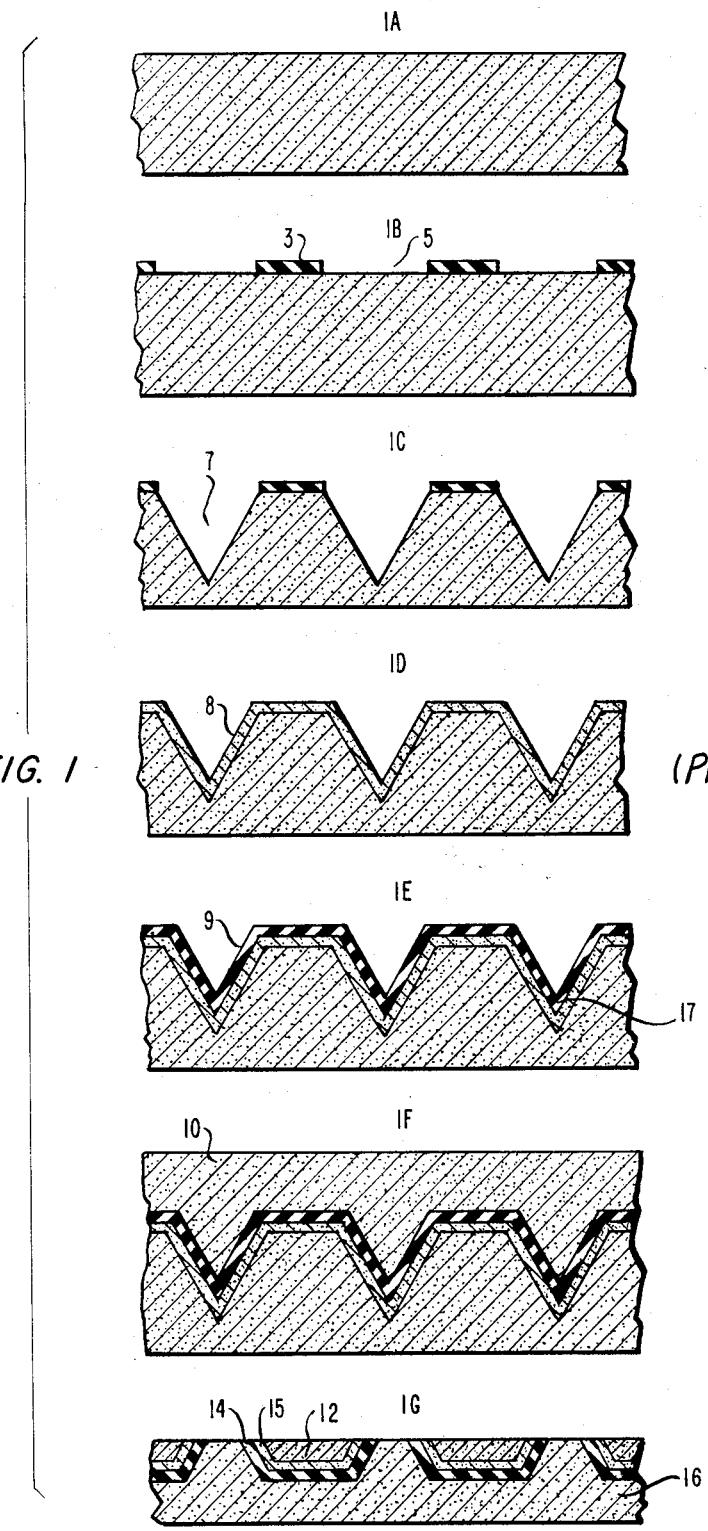
FIG. 1 illustrates one method of producing dielectrically isolated silicon.
Figure 2:
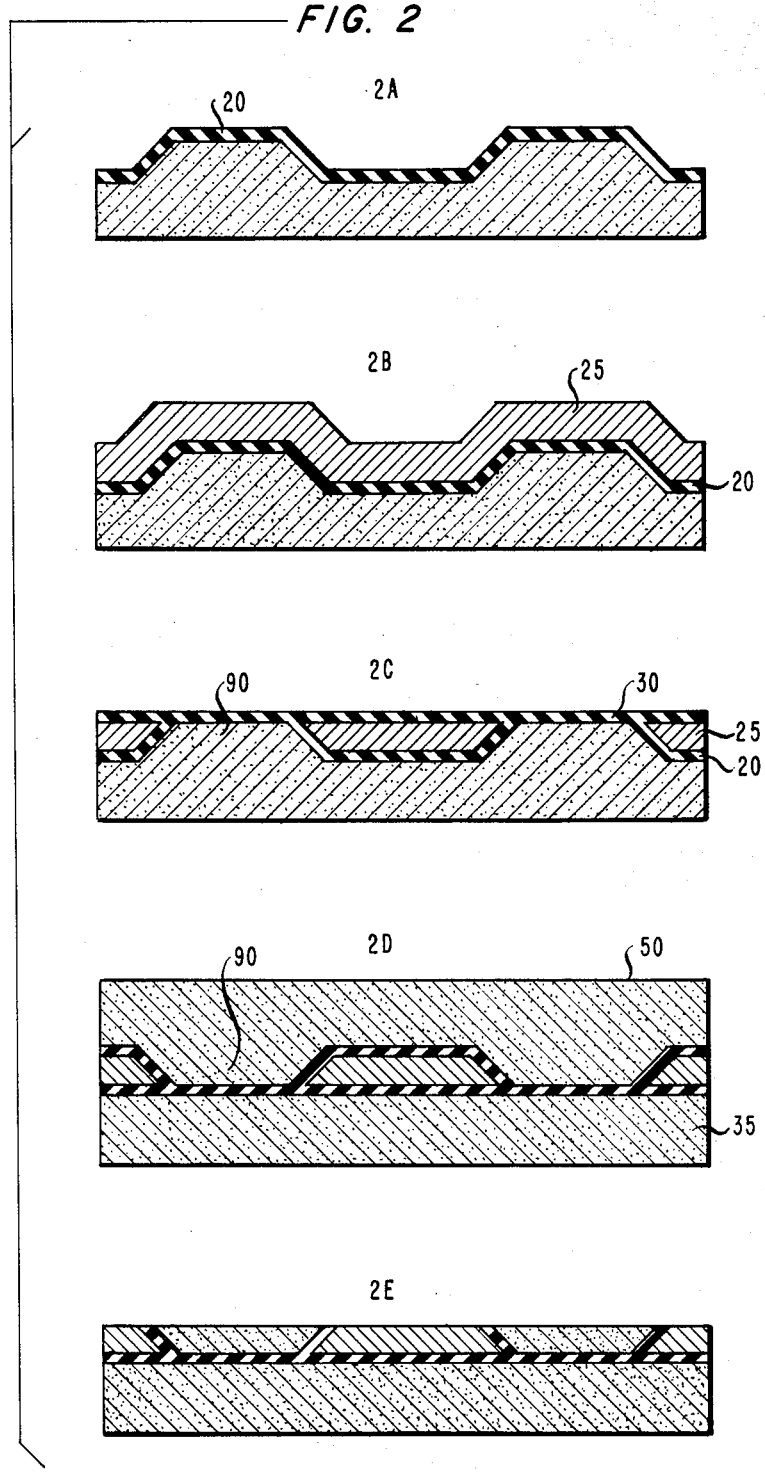

As discussed, the object of the invention is to form a region of device quality silicon which is dielectrically isolated and ultimately to form dielectrically isolated devices. This objective is achieved by a process which includes fusing two bodies by the application of heat and a suitable electrical potential. A variety of such processes are available for producing the dielectrically isolated structure. For example, as shown in FIG. 2, a high-quality silicon wafer is grooved and the surface is oxidized as shown at 20. A layer of polysilicon, 25, is deposited on the oxide, 20, the entire structure is polished flat, and the remaining polysilicon surface is oxidized to yield the structure shown at 2C where 30 is an oxide layer. A second wafer, 35, is then fused to the first 90 as shown at 2D. A removal of area, 50, yields the dielectrically isolated structure shown at 2E.

In a similar process, the deposited polysilicon, 60, is not polished completely down to the initial oxide, 20. Instead, after partial thinning, its surface is oxidized to yield the structure, 3A. This wafer, is then fused to a second wafer, 70, and thinned to yield the dielectrically isolated structure, 3B. Alternatively, two wafers, at least one of which has an oxide surface, are bonded resulting in structure, 4A. The structure is thinned to produce, 4B, and grooves are etched to yield the dielectrically isolated structure, 4C. These techniques are only exemplary of the variety of methods within the inventive process which rely on a fusion step. In each case as can be seen, at least two bodies are fused and these bodies have certain specific properties. At least one body is chosen so that it has a region of silicon of sufficient quality to be useful as a device active region. It is possible for this body to have the single crystal region included in the surface, 80, in FIG. 4 which is exposed after fusion. However, as shown at 90 in FIG. 2, the body need not have the single crystal region at the exposed surface.

The second body, need not have a region of high-quality silicon. The surfaces to be fused preferably should be smooth, i.e., typically surface features less than 1000 Å, and should be placed as far as possible in contact on a macroscopic scale. At least one and preferably both of the silicon bodies should have a surface region of silicon oxide. The thickness of these silicon oxide regions depends on the degree of dielectric isolation which is desired. The greater the thickness of the silicon oxide regions in the final, fused composite structure, the greater the dielectric isolation, (i.e., the higher the voltage required to produce breakdown across the dielectric material) and also the smaller the capacitance. For typical high-voltage circuits, breakdown voltages for the dielectric material is a major concern and is generally in the range from 300 to 3000 V which correspond to final oxide thicknesses in the fused structure ranging from 1 to 10 μm. For high-speed circuits operating at nominal voltages, e.g., 5 to 30 V, capacitance is the major concern. To yield acceptable capacitance, final oxide thicknesses in the range 0.5 to 5 μm are generally employed. The desired regions of silicon oxide of an appropriate thickness are formed by conventional techniques. The composition of the silicon oxide need not be precisely stoichiometric, i.e., precisely $SiO_2$. The composition is not critical provided the oxide which is employed is physically stable and does not degrade at the processing temperature. Additionally, the oxide should not have so many oxygen vacancies that excessive charge trapping is produced which leads to long-term instabilities in device properties. The use of thermal oxidation, chemical vapor deposition (CVD), plasma enhanced oxidation, or sputtering of silicon oxide are useful expedients for forming the desired silicon oxide region on the bodies to be fused. (A description of these techniques for forming silicon oxide material is found in E. H. Nicollian and J. R. Brews, *MOS:Physics and Technology,* (Wiley Interscience: New York, 1982).)

The two bodies are contacted and then are fused by subecting their interface to heat and to an electrical potential drop. The relative position of the two bodies during their fusion determines the relative configuration of the final fused body. The position of the silicon oxide region(s) on a particular body and the relative positioning of the two bodies should be done so that a silicon oxide region of suitable thickness underlies the active region to be isolated, i.e., so that the presence of silicon oxide alone or together with other dielectrics such as air (3 in FIG. 4) ultimately provide the desired isolation in the processed body. Typically, for convenience, a silicon oxide region is formed entirely across at least one major surface of at least one of the silicon bodies. However, formation of oxide over only a portion of the surface is contemplated and is not precluded provided dielectric isolation of the desired active regions is achieved as described. It should, however, be noted that fusion between the bodies occurs solely at the interface where silicon oxide is present.

Figure 5:
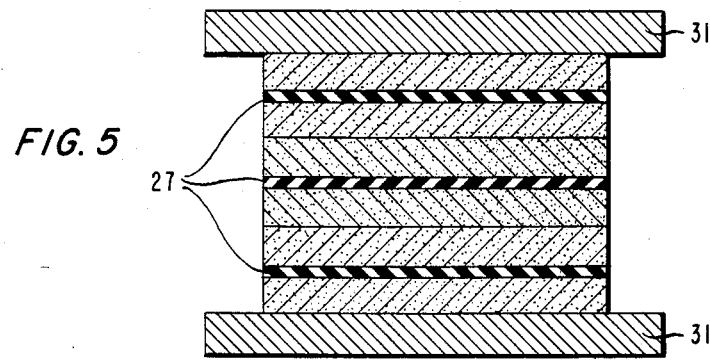
Figure 6:
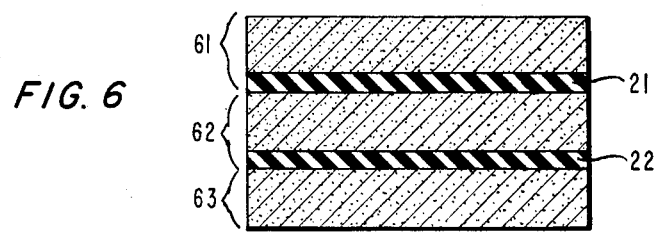

As discussed, bonding occurs only between a region of silicon and a region of silicon oxide or between two regions of silicon oxide. It is possible with only one set of electrodes, 31, in FIG. 5, to bond a number of pairs of bodies. Silicon wafers each having one silicon oxide covered surface are stackable as shown in FIG. 5 so that the silicon oxide surfaces are contacted at every other interface. Bonding occurs only where silicon oxide is present, i.e., at interface, 27. In this manner, a number of pairs of bodies are fused without unwanted fusion between the pairs. Additionally, it is possible and not precluded to fuse three or more bodies together. For example, as shown in FIG. 6, three bodies, 61, 62, and 63, are fused by having silicon oxide layers, 21 and 22, at the two interfaces formed when the three bodies are contacted. The fusion of three or more bodies offers the potential of producing vertically integrated circuits with increased packing densities.

Once the bodies to be fused are suitably contacted, a potential difference is produced across each interface involving a silicon oxide region. The potential is conveniently applied by utilizing contacts in the form of electrodes that are fabricated with suitable conductors such as carbon or silicon carbide. (The contact material should be capable of withstanding high temperatures and should not react at these temperatures with the materials of the wafer which they contact.) Surprisingly, only nominal electrical potential differences across each oxide layer are required for the fusion process. Indeed, relatively high potential differences, i.e., differences over 100 V tend to cause dielectric breakdown to occur at the processing temperatures employed. The voltage difference at which dielectric breakdown occurs depends on the treatment temperature and the oxide thickness. For example, breakdown for a 4 μm thick oxide at 1100 degrees C. often occurs at a 50 V difference after a few minutes, while for a 1 μm thick oxide at 1100 degrees C. breakdown often occurs at a 20 V difference after a similar time. In any case, for practical temperatures and oxide thicknesses, generally a 100 V, preferably a 50 V, difference should not be exceeded. The exact voltage difference employed depends on the thickness of the silicon oxide regions. Typically, the silicon bodies themselves offer relatively small electrical resistances at the fusion temperature and, thus, the potential difference required relates directly to the thickness of the oxide regions at the interface. Generally, for oxide thicknesses in the range 1 to 10 μm, potential differences in the range 5 to 50 V, preferably in the range 10 to 30 V, are employed. It should be noted that the potential difference across the oxide region is the significant factor. If a stack of wafer pairs is to be bonded, the voltage applied across the entire stack is the sum of the individual potential drops across each oxide region. (The voltage differences given refer to dc voltages. However, low-frequency ac voltages are useful and rms voltage levels corresponding to the dc values are appropriate.)

Figure 7:
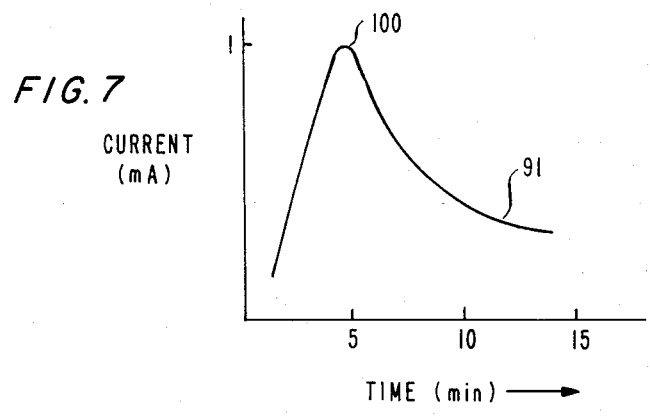
FIG. 7 illustrates behavior observed in the inventive method.

Nominal potentials are sufficient and thus avoidance of difficulties associated with breakdown is possible through the initial presence of OH moieties in the silicon oxide during fusion. For example, excellent fusion occurs when two silicon wafers each having 3.5 μm thick layers of steam-grown oxide and each stored at room ambient for two weeks are soaked in water for a half hour and subsequently bonded at 1100 degrees C. for 15 minutes at 20 V. (The water interacts with silicon oxides to form OH moieties.) In contrast, identical wafers bonded under substantially identical conditions but without being soaked in water show strong bonding only over a small fraction of the oxide regions. Essentially, no fusion is observed under the same conditions either when an identical oxide which had been baked at 1150 degrees C. for 15 minutes is employed, or when an oxide which has been left in ambient air for a number of weeks is utilized. A contemplated explanation of the effect of OH moieties is that the applied nominal voltages induce an unexpectedly large electrostatic attraction by enhancing the conductivity of the oxide region between the two bodies. The presence of sufficient OH moieties to produce a suitable bond at nominal voltage is detectable by monitoring the current flow induced by the applied potential during the fusion treatment. (See FIG. 7 for a representative curve obtained from such a measurement.) As can be seen in FIG. 7, the current initially increases rapidly to a level denoted, 100, and then slowly decreases to the level denoted, 91. The initial rapid increase is an indication that OH moieties are present. When the current has decreased to the level, 91, the fusion process has been essentially completed. That is, most of the bonding takes place by the time the current reaches the peak level, 100, and that further fusion beyond this point is relatively minor. (The observation that the height of the current peak correlates with the amount of OH moieties present in the oxide supports the contemplated explanation that the subsequent decay is related to loss of OH moieties through processes such as the out diffusion of water. Additionally, the plateau, 91, has been found to correspond to conduction through the ambient gas in the furnace. At the plateau essentially no current is being driven through the fused bodies.) In fact, the time required for bonding utilizing a given water content, fusion temperature, and voltage is determined by using a controlled sample and monitoring the current as described. The time period required to reach the level, 100, is that which is adequate for the desired fusion.

It is possible to introduce OH moieties into the oxide by a variety of expedients. For example, the oxide is immersed in water. Alternately, where a steam oxide without water soaking is employed, the water present from the steam oxidation is sufficient to cause a substantial level of bonding. Once this level of bonding is achieved, enhanced fusion is inducible by a post-treatment anneal. For example, in the steam oxide case described above, annealing with nitrogen at 1200 degrees C. for 15 minutes produces a uniform, strong bond similar in characteristic to that obtained for the water soaked oxides. Thus, if water is present, either through the inventive treatment or through the inventive treatment together with a subsequent anneal, excellent bonding is achievable. However, if there is no substantial presence of OH moieties, such fusion irrespective of post-treatment is not achievable.

It is important to ensure the presence of OH moieties at the time the treatment is performed. Thus, it is desirable that the treatment temperature be reached in a relatively short time. In this manner, excessive loss of OH moieties does not occur before temperatures adequate to cause fusion are attained. Typically, fusion temperatures should be reached in a period shorter than 15 minutes, preferably shorter than 5 minutes. This criterion is easily achieved by inserting the samples into an ambient that is already heated to the desired temperature.

The specific voltage and temperature utilized for fusion are interdependent. The higher the temperature, the more conductive the oxide. Therefore, to avoid electrical breakdown, lower voltages are utilized in conjunction with higher temperatures. Further, the greater the mismatch in geometry between the two bodies to be fused, the greater the voltage necessary to produce intimate contact between these two bodies through electrostatic attraction. Since silicon oxide and silicon have a relatively large expansion mismatch, the higher the temperature, the greater the distortion of each body. Consequently, the higher the temperature the greater the voltage needed to produce contact between the two bodies. The factors related to contact and breakdown produce opposite requirements on the voltage. Thus, a compromise is necessary. Typically, a controlled sample is employed to determine a suitable voltage difference and temperature to satisfy both the contact and breakdown requirements. As previously discussed, voltage differences below 100 V and generally in the range 10 V to 30 V, are employed. With these voltage differences it is desirable to employ a temperature in the range 1050 to 1200 degrees C. preferably in the range 1100 to 1200 degrees C. Typically at temperatures below 1050 degrees C., fusion does not occur. Adequate fusion does occur between 1050 and 1100 degrees C. However, as the temperature decreases from 1100 degrees C. toward 1050 degrees C., the reliability of the fusion process also decreases. At temperatures approaching 1050 degrees C. the probability of attaining an adequate fusion decreases from essentially one to a significantly lower level. If high yields are desired for a particular application, then temperatures above 1100 degrees C. should be employed. Temperatures above 1200 degrees C. are also less desirable (but not precluded) since they tend to induce defect formation in the silicon and tend to increase the probability of dielectric failure.

After the two bodies are fused, it is often desirable to thin the region where electronic devices are to be formed. Typically, composite structures having thicknesses in the range 200 to 800 $\mu$m are employed for mechanical stability. Generally, it is desirable that the thickness of the active region for device application such as high-voltage integrated circuits be in the range 30 to 100 $\mu$m. Thinning to the desired level is accomplished by a conventional process such as mechanical and/or chemical grinding and polishing. It is also desirable for applications such as digital circuitry operating at nominal voltages to employ even thinner active regions. To achieve regions of this thickness, thinning procedures such as dopant selective chemical etching are utilized. (See Vossen and Kern, *Thin Film Processes*, (Academic Press: New York, 1978).)

The following examples are illustrative of the subject invention.

EXAMPLE 1

1. Description of the Apparatus

Fusion was performed in a conventional three-zone tube furnace (Centigrade Systems Model 72) capable of attaining a temperature of 1300 degrees C. The chamber of the furnace was a quartz tube having an inner diameter of 3¼ inches and a length of 5 feet. Nitrogen gas was admitted at the back of this tube, and the front was covered by a fitted glass cap which had several ports to allow entry of electrical connection and to provide a gas exhaust. (An oxygen ambient was also found to produce desirable results.) A quartz push-rod formed from ¼ inch diameter tubing and 3 feet in length was rigidly attached at one end to the cap and attached to the wafer and electrode assembly at its other end. This wafer and electrode assembly included a platform measuring 3 inches×4 inches with quartz supporting rods beneath it which maintained the platform in the center of the furnace tube as the assembly was inserted into the furnace. Two carbon plates (Poco graphite, manufactured by Union 76 Corporation) 1 mm in thickness and 3 inches×4 inches rested on the platform. These carbon plates had tabs ¾ inches×¾ inches to which platinum wires were attached which extended from the plates to the end cap. The silicon wafers to be fused were placed together between these two electrodes such that their front surfaces, at least one of which was coated with silicon dioxide, were contacting each other and their back surfaces, which had no oxide, contacted the upper and lower electrodes respectively. The entire assembly of electrodes and wafers was kept in alignment by four quartz pins, ¼ inch in diameter and ⅜ inches in height, which extended upward from the platform through four corresponding holes in each carbon electrode. These pins were spaced about the periphery of the silicon wafers and prevented the electrodes and wafers from shifting relative to each other during insertion into or withdrawal from the furnace. With this arrangement, the wafers could be placed between the electrodes and the entire assembly pushed into the furnace until the cap covered its end, at which point the wafers and electrodes were in the hottest part of the furnace. A thermocouple was inserted down the length of the quartz pushrod to monitor the temperature during fusion. The platinum wires were connected to a conventional voltage source via a 100 ohm series resistor which was used to monitor the current flow through the samples.

2. Silicon Body Preparation

The samples were conventional single-crystal silicon device wafers, 3 inches in diameter, 600 to 700 $\mu$m in thickness having their major surface oriented in the (100) plane. A variety of dopants and dopant levels were employed including wafers with resistivities ranging from 0.10 to 200 ohm-cm induced by p-type boron doping and resistivities from 10 to 40 ohm-cm induced by n-type, phosphorus doping.

All of the oxides were grown by conventional steam oxidation at 1150 degrees C. Oxide thicknesses of 0.5 $\mu$m and 3.5 $\mu$m were examined. The oxide was removed from the backs of the wafers by the conventional method of masking the front with photoresist and chemically etching the oxide from the back. After etching, these wafers were thoroughly cleaned and placed in closed containers to prevent any contamination prior to use.

EXAMPLE 2

Oxide to Silicon Fusion

Wafers (200 ohm-cm p-type) having 3.5 $\mu$m of oxide on their front surfaces were fused to unoxidized wafers of varying resistivities. The wafers were inserted into the furnace as described in Example 1 and brought to 1100 degrees C. in a time of approximately 5 minutes. At this time a voltage of 10 V was applied. (It was determined that fusion occurred only if the oxidized wafer was biased negatively with respect to the unoxidized wafer.) In some cases, 10 V was not adequate to induce an appreciable current flow, but a brief (~100 msec) voltage pulse of 20 to 40 V initiated the process after which bonding proceeded at 10 V. Applied voltages in excess of 20 V for any appreciable amount of time (e.g., several minutes) tended to cause breakdown of the oxide. The voltage was applied for 20 minutes and then the wafer/electrode assembly is withdrawn from the hot zone of the furnace and allowed to cool under nitrogen flow at the cool end of the furnace tube.

The resistivity and conductivity type of the unoxidized wafer did not have any detectable effect on the fusion process. Bond strength was evaluated by mechanically separating the wafer pairs after fusion. It was determined that bonding under the above conditions was very strong only in a few small regions of the wafers, the remaining portions were more weakly fused together. Subsequent heat treatment in nitrogen at temperatures of 1200 to 1250 degrees C. for a time of 10 to 15 minutes proved adequate to yield a uniformly strong bond over essentially the entire surface of the wafers.

EXAMPLE 3

Oxide to Oxide Fusion

The procedure of Example 2 was followed except 200 ohm-cm, 10 ohm-cm and 1 ohm-cm p-type wafers having an oxide thickness of 3.5 $\mu$m, and 200 ohm-cm p-type wafers having an oxide thickness of 0.5 $\mu$m were fused together in various combinations. For bonding 3.5 $\mu$m oxides to 3.5 $\mu$m oxides, a voltage of 20 V was generally used at a temperature of 1100 degrees C. For bonding 3.5 $\mu$m to 0.5 $\mu$m oxides, 15 V was used, and for 0.5 $\mu$m to 0.5 $\mu$m bonding, 10 V was used. In all cases, strong fusion occurred. Indeed, at 1100 degrees C., an applied voltage of only 2 V was sufficient to fuse two 3.5 $\mu$m oxides together over a single region which comprised about 20 percent of the wafer area. As in the oxide to silicon fusion, it was found that subsequent heating above 1200 degrees C. improved bond strength and uniformity.

No differences were observed to arise from different wafer resistivities. Unlike the oxide to silicon fusion, there is no preferred polarity for oxide to oxide fusion, particularly when both oxides are of the same thickness. In fact, satisfactory fusion occurs when a low frequency (1/10 Hz) ac bias is applied. For 3.5 $\mu$m oxide fused to 3.5 $\mu$m oxide at 20 V, dielectric breakdown was not observed in more than fifty trials.

EXAMPLE 4

Effect of OH Moieties

Two 3.5 $\mu$m oxides were heated to a temperature of 1150 degrees C. as described in Example 3. The current was monitored as a function of time during the fusion process. At 1150 degrees C., the time required for the current decay was determined to be typically 15 minutes. Identically treated wafers were allowed to remain at 1150 degrees C. for 15 minutes with no applied bias. A bias of 20 V after such treatment failed to produce the usual current peak, and after 20 minutes of applied bias, it was found that no fusion had occurred.

Oxidized wafers were soaked in clean, distilled water for times varying from 5 minutes to 2 hours at room temperature. In order to ensure that the fusion process occurred as early as possible, the voltage (20 V) was applied before insertion in the furnace. It was found that significant electrical conduction (current greater than 100 $\mu$A) occurred at lower temperatures as the time of exposure to water was increased, and that the current peak increased directly with increased time of water exposure. Wafers exposed to water for a half hour exhibited very strong, uniform fusion at 1100 degrees C., without a subsequent 1200 degrees C. anneal.

What is claimed is:

1. A process for producing a dielectrically isolated silicon region comprising the steps of (1) contacting a first and second body so that a silicon oxide and OH moieties are present at the interface between said first and second body and fusing said first and second bodies, wherein said fusion is accomplished by producing an electrical potential drop across said interface of less than 100 volts and subjecting said interface to a temperature of at least 1050 degrees C. whereby said silicon oxide forms at least a portion of said dielectric isolation for a region of single crystal silicon in said first or second body and (2) forming a device in said single crystal region of silicon.

2. The process of claim 1 wherein said potential difference is less than 50 volts.

3. The process of claim 1 wherein said first and said second body comprise silicon.

4. The process of claim 1 wherein said first and said second body have a surface including a region of a silicon oxide.

5. The process of claim 1 including the step of annealing said first and said second body after said fusion.

6. The process of claim 1 wherein said dielectric isolation is provided completely by a silicon oxide which comprises said silicon oxide present at said interface.

* * * * *